United States Patent
March et al.

(10) Patent No.: US 11,875,936 B2
(45) Date of Patent: Jan. 16, 2024

(54) METHOD FOR HOMOGENIZING A MAGNETIC FIELD PROFILE OF A SUPERCONDUCTOR MAGNET SYSTEM

(71) Applicant: Bruker Switzerland AG, Fällanden (CH)

(72) Inventors: Stephen Alfred March, Zurich (CH); Joerg Hinderer, Waldshut-Tiengen (DE); Franck Borgnolutti, Duebendorf (CH)

(*) Notice: Subject to any disclaimer, the term of this patent is extended or adjusted under 35 U.S.C. 154(b) by 0 days.

(21) Appl. No.: 18/053,180

(22) Filed: Nov. 7, 2022

(65) Prior Publication Data
US 2023/0146604 A1    May 11, 2023

(30) Foreign Application Priority Data
Nov. 9, 2021 (EP) .................................. 21 207 337

(51) Int. Cl.
*H01F 6/06* (2006.01)
*H01F 6/04* (2006.01)

(52) U.S. Cl.
CPC ....... *H01F 6/04* (2013.01); *H01F 6/06* (2013.01)

(58) Field of Classification Search
CPC .................................................. H01F 6/04–06
(Continued)

(56) References Cited

U.S. PATENT DOCUMENTS 5,296,812 A * 3/1994 Kitamura ........... G01R 33/3815
324/319
6,169,401 B1 * 1/2001 Fujita ................. G01R 33/3678
324/318
(Continued)

FOREIGN PATENT DOCUMENTS

DE    19908433 A1    6/2003
EP    3492941 A1    6/2019
(Continued)

OTHER PUBLICATIONS

John H. Durrell, et al., "Bulk superconductors: a roadmap to applications", Superconductor Science and Technology, IOP Publishing, Techno House, Bristol, GB, vol. 31, No. 10 (2018).
(Continued)

*Primary Examiner* — Alexander Talpalatski
(74) *Attorney, Agent, or Firm* — Benoît & Côté Inc.

(57) ABSTRACT

A method is provided for homogenizing a magnetic field profile of a superconductor magnet system having a cryostat with a room temperature bore, a superconductor bulk magnet with at least three axially stacked bulk sub-magnets, arranged coaxially with the room temperature bore, and a cryogenic cooling system for cooling the superconductor bulk magnet. The cryogenic cooling system independently controls the temperature of each bulk sub-magnet to provide different respective temperatures to the sub-magnets and thereby provide the sub-magnets with different relative currents such that a first subset of the bulk sub-magnets are almost magnetically saturated, and a second subset of the bulk sub-magnets are significantly away from magnetic saturation. By controlling a heating power and/or a cooling power at the bulk sub-magnets without measuring the temperatures of the bulk sub-magnets, the respective currents of the bulk sub-magnets are changed to increase a homogeneity of the field profile.

15 Claims, 8 Drawing Sheets

(58) Field of Classification Search
USPC .......................................................... 335/216
See application file for complete search history.

(56) References Cited

U.S. PATENT DOCUMENTS

| | | |
|---|---|---|
| 6,169,402 B1 | 1/2001 | Oka et al. |
| 7,859,374 B2 | 12/2010 | Iwasa et al. |
| 8,228,148 B2 | 7/2012 | Iwasa et al. |
| 8,948,829 B2 | 2/2015 | Morita et al. |
| 9,564,262 B2 | 2/2017 | Ito et al. |
| 2020/0161039 A1* | 5/2020 | Hinderer .................. H01F 6/00 |

FOREIGN PATENT DOCUMENTS

| | | |
|---|---|---|
| EP | 3493226 A1 | 6/2019 |
| EP | 3657193 A1 | 5/2020 |
| EP | 3910651 A1 | 11/2021 |
| EP | 4080527 A1 | 10/2022 |
| JP | 5360638 B2 | 12/2013 |
| WO | 2016161336 A1 | 10/2016 |

OTHER PUBLICATIONS

LTspice | Design Center | Analog Devices (https://www.analog.com/en/design-center/design-tools-and-calculators.html), 2021. [retrieved Mar. 29, 2021].

\* cited by examiner

METHOD FOR HOMOGENIZING A MAGNETIC FIELD PROFILE OF A SUPERCONDUCTOR MAGNET SYSTEM

BACKGROUND OF THE INVENTION

Field of the Invention

The invention relates to a method for homogenizing a magnetic field profile of a superconductor magnet system.

Description of the Related Art

A superconductor magnet system described in published European Patent Application EP 3910651 A1 comprises:
a cryostat having a room temperature bore,
a superconductor bulk magnet, contained in the cryostat and arranged coaxially with the room temperature bore, and
a cryogenic cooling system adapted for cooling the superconductor bulk magnet,
wherein the superconductor bulk magnet comprises at least N axially stacked bulk sub-magnets, with N≥3,
wherein in an initial state, the bulk sub-magnets carry respective initial currents with relative proportions according to an initial distribution scheme, and the method comprises a posterior correction step which changes the initial currents into final currents with relative proportions according to a final distribution scheme which is different from the initial distribution scheme,
wherein a magnetic field profile of the superconductor bulk magnet based on the final currents is more homogenous than a magnetic field profile based on the initial currents,
wherein the cryogenic cooling system is adapted for independently controlling the temperature of each bulk sub-magnet,
and wherein for changing the initial currents into the final currents, temperatures of at least a part of the bulk sub-magnets are chosen at least temporarily different from each other, such that
for a first part of the bulk sub-magnets, the bulk sub-magnets of this first part are at least almost magnetically saturated, in particular with at least 99% relative magnetic saturation, and
for a second part of the bulk sub-magnets, the bulk sub-magnets of this second part are significantly away from magnetic saturation, in particular with at most 95% relative magnetic saturation.

Superconductors are materials that may carry an electrical current at practically no ohmic losses. Superconductors are, for example, used to generate magnetic fields of high strength, in particular for use in nuclear magnetic resonance (NMR) applications. Superconductors have to be exposed to cryogenic temperatures, though, since superconductivity is only assumed below a critical temperature $T_{crit}$, which is specific for the superconductor material. Accordingly, superconductors are typically arranged in a cryostat for thermal insulation.

Common superconductor applications use superconductor lines, such as tape shaped or wire shaped superconductor lines. The superconductor lines may be used directly (for example for current transport) or after having been brought in a desired form, for example by winding coils. In particular, superconductor coils for high field applications are typically made from superconductor lines wound in a solenoid type fashion.

However, superconductor bulk magnets are also known. In this case, a superconducting current circulates inside a piece or stacked pieces of superconductor, with the superconductor bulk magnet in general being of closed ring shape. Such structures are simple and inexpensive to produce, and are often made from high temperature superconductor (HTS) material.

Superconductor bulk magnets may be loaded by a procedure called "field-cooling", e.g., described in U.S. Pat. No. 7,859,374 B2. For this procedure, the superconductor bulk magnet is disposed inside the charger bore of an electrical charger magnet, and then the charger magnet is turned on and generates a magnetic field while the superconductor bulk magnet's temperature $T_{bulk}$ is still above $T_{crit}$. Then the superconductor bulk magnet is cooled below $T_{crit}$ and becomes superconducting. Subsequently, with $T_{bulk}$ kept below $T_{crit}$, the charger magnet is turned off; by this means, a current is induced in the superconductor bulk magnet, such that the magnetic flux within the superconductor bulk magnet is maintained. In other words, the superconductor bulk magnet traps the magnetic field in its inside. Then the superconductor bulk magnet may be removed from the charger magnet, and may be transported to a place where the trapped magnetic field may be used.

For many applications, such as above-mentioned NMR applications, a high homogeneity of a magnetic field is desirable. However, the typical magnetic field of a superconductor bulk magnet magnetized via the field-cooling process and provided in its superconductor bore has a relatively low homogeneity.

EP 3 492 941 A1 proposes a bulk magnet structure comprising a plurality of axially stacked, ring-shaped bulk bodies of identical outer radial diameter and of different radial thickness. A central bulk body has the smallest radial thickness. Between the bulk bodies, metal planar rings of high thermal conductivity are arranged. The bulk magnet structure is charged by field-cooling in a basic magnetization step. Then in a first temperature adjustment step, the temperature of the bulk magnetic structure is raised to improve the uniformity of the magnetic field distribution, wherein the central bulk body is brought into a fully magnetized state. In a second temperature adjustment step, the temperature of the bulk magnetic structure is lowered.

This procedure allows some redistribution of electric currents within the bulk magnetic structure for magnetic field homogenization, but the achievable current distribution is restricted by the distribution of radial thickness of the ring-shaped bulk bodies, i.e., by a hardware design. Accordingly, compensation of magnetic field inhomogeneity due to production tolerances is rather limited.

In European Patent Application EP 3910651 A1, a superconductor magnet system and several methods are proposed for homogenizing a magnetic field profile of the superconductor magnet system. The superconductor magnet system comprises a cryostat, a superconductor bulk magnet with a plurality of bulk sub-magnets and a cryogenic cooling system. The cryogenic cooling system is adapted for independently controlling the temperature of each bulk sub-magnet and comprises a temperature sensor at each bulk sub-magnet and an adjustment unit for adjusting a heating power and/or a cooling power at each bulk sub-magnet. In one method it is proposed to correct an initial, less homogeneous magnetic field carried by the superconductor bulk magnet. For this purpose, at least temporarily, a first part of the bulk sub-magnets is brought at least close to magnetic saturation by increasing the temperature, whereas a second part of the bulk sub-magnets is kept significantly from magnetic saturation. In this way, some drift can be initiated in the first part, whereas the second part stays stable, and the magnetic field contributions of the different bulk sub-magnets can be adjusted this way in order to increase homogeneity of the magnetic field. During the method the magnetic field profile is repeatedly measured. In the example presented in FIG. 22, among other parameters, the temperatures of the different bulk sub-magnets are shown as a function of time. The description of the workflow of FIG. 27 describes to carry out the method on the above-described superconductor magnet system comprising a temperature sensor for each bulk sub-magnet.

Such temperature sensors at the bulk sub-magnets make the superconductor magnet system or its cryogenic cooling system more complex and thus more expensive. Further, the temperature sensors require some additional space which is scarce inside the superconductor's cryostat and inside the charger bore of the charger magnet, what may reduce the system performance at a given system size and thus the cost efficiency.

Published European patent application EP 4080527 A1 further discloses a method for field cooling of a superconductor magnet system comprising a plurality of bulk sub-magnets, wherein the bulk sub-magnets are sequentially cooled and charged according to a pre-calculated charger current step pattern.

SUMMARY OF THE INVENTION

The invention provides a method with which a magnetic field profile of a superconductor magnet system may be homogenized in a simple and inexpensive way. This object is achieved, in accordance with the invention, by a method as introduced in the beginning, characterized in that for changing the initial currents into the final currents, the temperatures of the bulk sub-magnets are chosen by controlling a heating power and/or a cooling power at the bulk sub-magnets without measuring the temperatures of the bulk sub-magnets, wherein for at least the part of the bulk sub-magnets, the heating powers are set at least temporarily different from each other and/or the cooling powers are set at least temporarily different from each other.

The invention proposes to change the initial currents into the final currents by change of the heating powers and/or the cooling powers of the bulk sub-magnets without knowledge of the exact temperature of each bulk sub-magnet. Temperature checks of individual bulk sub-magnets are dispensed with entirely, simplifying the homogenization of the magnetic field in the posterior correction step. This means that the inventive method can be carried out on a superconductor magnet system without temperature sensors for the individual bulk sub-magnets. The design of the superconductor magnet system can be kept simple, and its costs can be kept lower, as compared to a superconductor magnet system containing such temperature sensors.

To carry out the inventive method, typically an initially trapped magnetic field profile, based on the initial currents carried by the bulk sub-magnets, is determined (measured). Then regions of the initially trapped magnetic field profile that need to be corrected to improve the field homogeneity, namely regions showing a locally higher than desired trapped magnetic field as compared to other regions are identified, and further the corresponding bulk sub-magnets responsible for the locally higher than desired trapped magnetic field and therefore requiring a current reduction ("first part of the bulk sub-magnets") of the initially trapped magnetic field profile are identified. Following this, the temperature of the bulk sub-magnets not requiring a current reduction ("second part of the bulk sub-magnets") is set/changed such that the respective bulk sub-magnets are significantly away from magnetic saturation. The temperature of the first part of the bulk sub-magnets is set/changed such that the respective bulk sub-magnets are at least almost magnetically saturated. This is done by setting/changing the heating power and/or the cooling power at the individual bulk sub-magnets (e. g. with an increase in heating power of a heater element for the first part of the bulk sub-magnets, or with an increase in cooling power of an adjustable thermal impedance for the second part of the bulk sub-magnets).

With the first part of the bulk sub-magnets at at least almost magnetic saturation, the bulk sub-magnets of the first part show a significant gradual loss of their currents ("drift"); the energy of the bulk sub-magnets in this first part slowly dissipates and weakens the contribution of the bulk sub-magnets in the first part to the magnetic field profile. Due to coupling, some of the magnetic flux (and respective electric current) may be taken over by other (non-saturated) bulk sub-magnets in the second part. The drift in the bulk sub-magnets of the first part is used for slowly adjusting the magnetic field profile, and in particular to homogenize it. It should be noted that the drift may be differently strong in different bulk sub-magnets of the first part, and/or may be set to last differently long in different bulk sub-magnets of the first part. In particular the bulk sub-magnets may individually shift between first and second part (typically from first to second part) during the posterior correction step.

To determine the strength of the drift and/or monitor the change of the magnetic field profile, measurements of the trapped magnetic field profile are typically carried out regularly, in particular periodically or continuously, during the posterior correction step. The heating power and/or the cooling power for the bulk sub-magnets of the first part may then be adjusted when for example there is no drift or the drift is too low. The adjustment is carried out without knowing the exact temperatures of the bulk sub-magnets.

When the desired magnetic field profile has been reached, the heating power and/or the cooling power at the (last remaining) bulk sub-magnets of the first part are changed such that the respective bulk sub-magnets are significantly away from magnetic saturation. It is also possible to gradually change the heating power and/or the cooling power shortly before the desired magnetic field profile is reached, in particular individually for each bulk sub-magnet of the first part. In this way the drift can be adjusted (i.e., weakened/slowed down) such that the correction of the magnetic field profile close to the end of the posterior correction step may be executed more precisely, resulting in a higher final magnetic field homogeneity. In particular, the risk of introducing inhomogeneities into the magnetic field profile by weakening the contribution of one or more bulk sub-magnets in the first part too strongly can be reduced.

So, in accordance with the invention, the heating power and/or cooling power at the individual bulk sub-magnets may be adapted using a feedback from repeated measurements of the magnetic field profile of the superconductor magnet system in the sample volume, and a particularly high field homogeneity may be achieved.

By means of individual control of heating power and/or cooling power, bulk sub-magnets may be freely selected for weakening their respective magnetic field contribution. Typically, only one bulk sub-magnet or two bulk sub-magnets are brought to at least almost magnetic saturation at a time. During the posterior correction step, the allocation of bulk sub-magnets to the first part or second part may change over time, if need may be also multiple times for individual bulk sub-magnets.

This method allows to establish a magnetic field with a very high homogeneity in a sample volume of the superconductor magnet system, is easy to execute and works without knowledge of the temperature.

In a preferred variant of the inventive method, the superconductor magnet system is designed without thermal sensors for measuring the temperatures of the bulk sub-magnets. Since the inventive method works without measuring the temperatures of the bulk sub-magnets, there is no need to equip the superconductor magnet system with thermal sensors at the respective bulk sub-magnets. However, note that typically there is one thermal sensor at a (common) cooling stage ("cooling plate"). The complexity of the superconductor magnet system is kept low, and the superconductor magnet system may have a compact design, as well as the overall costs may be decreased.

In another preferred variant, in the first part, the heating powers at the bulk sub-magnets are chosen at least temporarily higher as compared to the second part, and/or in the first part, the cooling powers at the bulk sub-magnets are chosen at least temporarily lower as compared to the second part. This is an easy way bring the bulk sub-magnets of the first part close to magnetic saturation, in particular if the bulk sub-magnets are of equal type (in particular of same size and material). Drift is then initiated in the first part of the bulk sub-magnets whereby the magnetic field contributions of the bulk sub-magnets of the first part can be adjusted.

Preferred is also a variant wherein during the posterior correction step, an intermediate magnetic field profile of the superconductor magnet system is repeatedly measured until a desired magnetic field profile based on the final currents is obtained, wherein between measurements, the heating power and/or cooling power at at least some of the bulk sub-magnets are changed and/or some time is waited. By the repeated measurements of the magnetic field profile, it is possible to learn about the current state, in particular drift state, of the bulk sub-magnets, without knowing the temperature. Further, progress of the method can be monitored. It is also possible to quickly react to unexpected changes in course of the inventive method. By the iterations of this variant, a particularly high homogeneity of the final magnetic field may be achieved.

In a preferred further development of this variant, from at least one measured intermediate magnetic field profile, one or a plurality of bulk sub-magnets are identified for which in order to increase a field homogeneity, their contribution to the magnetic field profile shall be reduced, in the following called overcharged bulk sub-magnets, and that for reducing the contribution of the overcharged bulk sub-magnets, for some time after the measurement of the intermediate magnetic profile, for one or a plurality of respective overcharged bulk sub-magnets the cooling power is chosen smaller and/or the heating power is chosen larger as compared to bulk sub-magnets not being overcharged bulk sub-magnets. This is a simple way to homogenize the magnetic field profile. The contribution of the respective axially stacked bulk sub-magnet to the magnetic field profile is strongest at its own axial position and is getting weaker further away from its own axial position. Generally, in order to adjust the magnetic field profile in the sample volume in the central region ($z=0$), one or more central bulk sub-magnets are adjusted with respect to heating/cooling power, and in order to adjust the magnetic field profile in the sample volume in a side region ($z>0$ or $z=0$), one or more side bulk sub-magnet(s) on the respective side are adjusted with respect to heating/cooling power.

In another preferred further development, for at least a part of the overcharged bulk sub-magnets, for a respective overcharged bulk sub-magnet, an amount by which the cooling power is chosen smaller and/or the heating power is chosen larger as compared to bulk sub-magnets not being overcharged bulk sub-magnets, is decreased with time in a final phase of reducing the contribution of the respective bulk sub-magnet to the magnetic field profile, in particular wherein decreasing of said amount depends on a remaining fraction by which the contribution of the respective bulk sub-magnet to the magnetic field profile shall be reduced as identified in one or more further measurements of an intermediate magnetic field profile. In this way it is possible to execute the final adjustment of the magnetic field profile carefully and precisely. Original inhomogeneities may be precisely eliminated, and introduction of new inhomogeneities can be minimized. The overall loss of magnetic field by the posterior correction step can be minimized.

Preferred is also a further development, which is characterized in that in at least one occasion after having changed the heating power and/or the cooling power at at least some of the bulk sub-magnets, a first time period is waited, and then at least:
- a first measurement of an intermediate magnetic field profile is done,
- a second time period is waited, and
- a second measurement of an intermediate magnetic field profile is done, wherein from at least the first and second measurement, a current drift characteristic of the intermediate magnetic field profile is determined, and wherein based on the determined current drift characteristic it is decided on next changes of the heating power and/or cooling power at at least some of the bulk sub-magnets and/or a next time to be waited. The first time period of waiting can ensure that possible relaxation processes due to the redistribution of the currents in the bulk sub-magnets (caused by the changes in heating power and/or cooling power) have been completed. In the second time period linear drift without such relaxation processes takes place. The second time period of waiting can ensure that an easily detectable change in currents has occurred to determine the drift characteristic. The determination of the drift characteristic can be made particularly precisely and provides reliable data for the correction of the intermediate magnetic field profile. During the first and the second time period, all heating powers and cooling powers should be kept constant to prevent the occurrence of new relaxation processes and thus receive useful and consistent data for the correction of the magnetic field.

Also within the scope of the present invention is a superconductor magnet system, comprising:
- a cryostat having a room temperature bore,
- a superconductor bulk magnet, contained in the cryostat and arranged coaxially with the room temperature bore, and
- a cryogenic cooling system adapted for cooling the superconductor bulk magnet, wherein the superconductor bulk magnet comprises at least N axially stacked bulk sub-magnets, with $N \geq 3$,
wherein the bulk sub-magnets are substantially ring shaped and arranged coaxially with the room temperature bore, wherein between each two axially neighboring bulk sub-magnets, an intermediate body is arranged, wherein the intermediate bodies are substantially ring-shaped and arranged coaxially with the room temperature bore, and the bulk sub-magnets are supported on the intermediate bodies, wherein the intermediate bodies are made from a non-metallic thermal insulator material, having a specific thermal conductivity smaller than a specific thermal conductivity of the material of the bulk sub-magnets, wherein the cryogenic cooling system is adapted for independently controlling the temperature of each bulk sub-magnet, wherein for each bulk sub-magnet, there is an adjustment unit for adjusting a heating power and/or a cooling power at the respective bulk sub-magnet, characterized in that the superconductor magnet system is configured without thermal sensors for measuring the temperatures of the bulk sub-magnets.

The inventive superconductor magnet system allows a purposeful setting of the temperature of each bulk sub-magnet of the superconductor bulk system. This, in turn, allows a purposeful magnetic saturation (or almost complete saturation) of single or multiple bulk sub-magnets after the inductive charging with a charger magnet, and thus a targeted redistribution of electric currents in the bulk sub-magnets. As a result, with the inventive superconductor magnet system, a highly accurate reshaping of the magnetic field generated by the superconductor bulk magnet becomes possible, in particular in order to achieve a high magnetic field homogeneity.

Electrical currents in the bulk sub-magnets may be set individually, and the individual setting of electrical currents can be performed in general with any magnet hardware. The invention does not require a particularly shaped bulk superconductor magnet or bulk sub-magnets, respectively, and may in particular use simple, inexpensive and compact magnet designs. In particular, the inventive superconductor magnet system works well with a hardware design which would cause magnetic field gradients if a default (basic) electric current distribution on the bulk sub-magnets was applied, such as an axially short superconductor bulk magnet.

The invention may apply a fine setting of electrical currents after the inductive charging of the superconductor bulk magnet, by inducing drift in one or a plurality of selected bulk sub-magnets until a desired magnetic field profile has been achieved; the magnetic field profile may be monitored for this purpose during the fine setting.

By arranging intermediate bodies made from a non-metallic thermal insulator material between the bulk sub-magnets, it is possible to thermally largely decouple neighbouring bulk sub-magnets, and to establish stable temperature differences between the bulk sub-magnets, both large or fine, as need may be. In this way, the degree of saturation of the magnetization of the bulk sub-magnets (or the corresponding electric current in the bulk sub-magnet) may be set very accurately. The thermal insulator material is typically a plastic material or a composite material including plastic.

As there is no need to check the individual temperature of the bulk sub-magnets for homogeneity purposes, there are no temperature sensors for the bulk sub-magnets. Without the temperature sensors the complexity of the superconductor magnet system can be reduced and thus it is getting less expensive. Without the additional space taken by the temperature sensors the system performance at a given system size may be increased and thus the cost efficiency can be improved.

The adjustment units are used to individually establish a desired heating power and/or cooling power at each bulk sub-magnet. The adjustment units are typically controlled by an electronic control unit. Typical adjustment units include an adjustable heater element and/or an adjustable thermal impedance, in particular linked to a common cooling stage.

The main superconductor bulk magnet or the respective bulk sub-magnets are in general made from a high temperature superconductor material, for example of ReBCO type (Re: rare earth element, in particular Eu, Y or Gd) or BSCCO type or of $MgB_2$ type or of pnictide.

The superconductor bulk magnet is substantially of cylindrical (cylinder jacket) shape and has a central (axial) bore, also called superconductor bore; it comprises a plurality of axially stacked bulk sub-magnets. The bulk sub-magnets are generally of closed ring shape, to allow for a persistent circular electrical current each. The currents in the bulk sub-magnets cause a magnetic field substantially along the axis of the central bore ("z-axis"). The bulk sub-magnets may be of "classic type" each, i.e., a one-piece ring grown from a melt. Alternatively, the bulk sub-magnets may each comprise a multitude of axial layers and/or radial layers, and may in particular be made of a multitude of stacked ring elements and/or may comprise a circumferential superconductor coating on a tube type carrier body or bodies. Typically, the superconductor bulk magnet comprises between 3 and 7 bulk sub-magnets the temperatures of which may be separately controlled.

A preferred embodiment of the superconductor magnet system is characterized in that for each bulk sub-magnet, there is a heater element thermally connected to the respective bulk sub-magnet, in particular wherein the heater element is controlled by the adjustment unit, with the adjustment unit being configured to set a variable heating power of the heater element to the respective bulk sub-magnet, and in particular wherein the heater element is an electric heater element. Heater elements are useful in quickly and accurately introducing individual heating power to the bulk sub-magnets and thus accurately and directly control the temperature at the bulk sub-magnets. Electric heater elements may be built particularly compact and are relatively inexpensive.

Another preferred embodiment is characterized in that the cryogenic cooling system comprises a common cooling stage for all bulk sub-magnets, and that for each bulk sub-magnet, there is a thermal connection from the common cooling stage to the respective bulk sub-magnet, in particular wherein the thermal connection includes a thermal switch controlled by the adjustment unit. This is a simple and compact way to provide the bulk sub-magnets with cooling power, in particular with an at least approximately equal cooling power to each bulk sub-magnet. The common cooling stage is thermally coupled to a cryocooler and simplifies the design. The thermal switches may block the cooling power temporarily, in particular during a posterior correction step. Note that often a constant cooling power is combined with a variable heating power at each bulk sub-magnet.

In a preferred further development, the thermal connection includes a variable thermal impedance controlled by the adjustment unit, with the adjustment unit being configured to set a variable cooling power at the respective bulk sub-magnet. In this way it is also possible to control the temperature at the bulk sub-magnets accurately and directly.

In an advantageous embodiment the superconductor magnet system further comprises a magnetic field sensor device for measuring a magnetic field profile within a sample volume of the room temperature bore. By knowing the magnetic field it is possible to determine the current influence of the different bulk sub-magnets on the magnetic field profile. Based on this information the bulk sub-magnets can be heated or cooled such that the magnetic field profile is adjusted, and in particular homogenized.

A preferred further development provides that the magnetic field sensor device comprises at least one sensor arranged on a movement stage by means of which the at least one sensor may be moved within the sample volume, for determining the magnetic field profile in the sample volume by repeated readout of the at least one sensor at different positions within the sample volume. Such a sensor ("single sensor") can be easily implemented. With the movement stage the at least one sensor can scan the sample volume. The density of measurement positions can be chosen flexibly. The sensor device may comprise an off-axis sensor and/or an on-axis sensor. In case of an off-axis sensor, the movement stage may also provide an azimuthal movement of the off-axis sensor.

An alternative preferred further development provides that the magnetic field sensor device comprises a layout of sensors distributed within the sample volume, the layout comprising at least N, preferably at least 2*N, sensors for determining the magnetic field profile in the sample volume by parallel readout of the sensors of the layout fixed in place. The layout of sensors enables a particularly fast (instantaneous) acquisition of the magnetic field profile; it may be operated continuously, if desired. The number of sensors in the layout of sensors can be increased to increase the precision of the measurement of the magnetic field profile. The sensors are typically provided off-axis, or both on-axis and off-axis.

In a preferred embodiment, the superconductor magnet system further comprises an electronic control unit for automatically homogenizing a magnetic field profile in the room temperature bore, wherein the electronic control unit is adapted for automatically homogenizing the magnetic field profile of the superconductor bulk magnet according to an above described inventive method, wherein the electronic control unit repeatedly receives measured intermediate magnetic field profiles measured with the magnetic field sensor device, and based on the intermediate measurements and without receiving or evaluating temperature data of the bulk sub-magnets, the electronic control unit automatically controls the heating power and/or cooling power at the bulk sub-magnets. The inventive method is well suited for automatic implementation and is fairly simple. In particular, it is not necessary to process any temperature data. The implementation of the electronic control unit is very comfortable for users. Availability of the superconductor magnet system may be improved.

Further within the scope of the present invention is the use of an inventive, above-described superconductor magnet system in an inventive, above-described method. In this way it is possible to homogenize a magnetic field in a simple and inexpensive way.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

DETAILED DESCRIPTION

Figure 1:
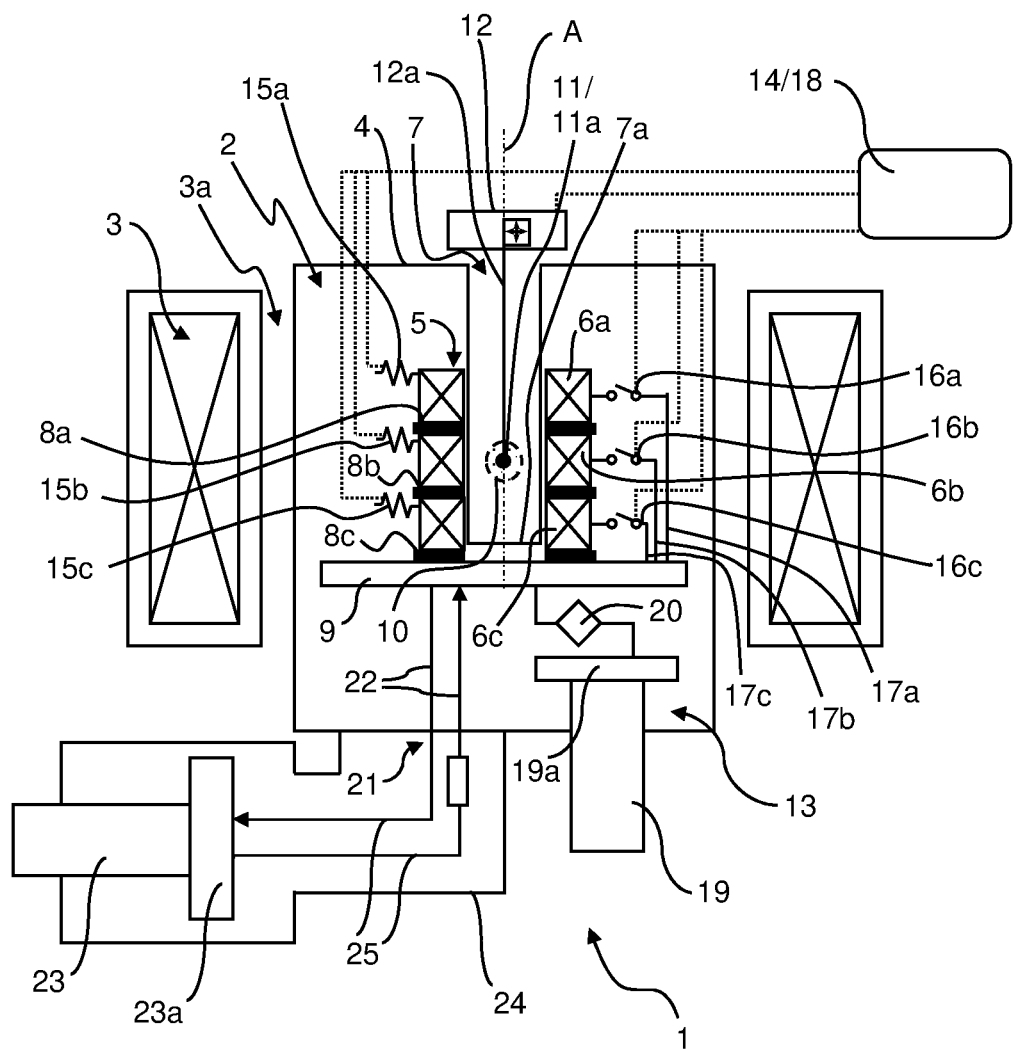
FIG. 1 shows a schematic view of a first embodiment of an inventive superconductor magnet system with a single on-axis magnetic field sensor, thermal switches and heaters, for performing the method according to the invention.

FIG. 1 shows in a schematic view a superconductor charging arrangement 1 by way of example, comprising a first embodiment of an inventive superconductor magnet system 2, arranged partially within a charger bore 3a of an electric charger magnet 3.

The electric charger magnet 3 may be of superconducting type or normally conducting type, and an electric charger current running within the electric charger magnet 3 may be set with an electronic charger magnet control unit (not shown in detail). By means of the electric charger magnet 3, a magnetic flux (or magnetic field) may be generated within the charger bore 3a, for the purpose of inductively charging the superconductor magnet system 2. The generated magnetic flux is oriented in general parallel to a central axis A.

The superconducting magnet system 2 comprises a cryostat 4, inside of which a vacuum is maintained for thermal insulation. Inside the cryostat 4, there is contained a superconductor bulk magnet 5, comprising here three bulk sub-magnets 6a, 6b, 6c. The bulk sub-magnets 6a-6c are generally of a closed ring shape, and are arranged axially stacked and coaxially with respect to the central axis A of the super-conductor magnet system 2; this results in an axially extending free space radially central inside the superconductor bulk magnet 5, called the superconductor bore 7. The bulk sub-magnets 6a-6c are made of a high temperature superconductor material, such as YBCO. The individual bulk sub-magnets 6a-6c are here formed by a single ring of bulk material each. It is also possible to combine a plurality of ring-shaped sheets of bulk material to form the individual bulk sub-magnets 6a-6c (not shown). Axis A is also called the z axis.

Axially between neighbouring bulk sub-magnets 6a-6c, there are arranged substantially ring-shaped, washer-like intermediate bodies 8a, 8b made here of polyimide material, for thermally insulating the bulk sub-magnets 6a-6c against each other. A further intermediate body 8c of polyimide material is located between the bottom bulk sub-magnet 6c and a common cooling stage 9 ("cold stage") for the bulk sub-magnets 6a-6c. The bulk sub-magnets 6a-6c rest upon the intermediate bodies 8a, 8b and the further intermediate body 8c.

In the example shown, the bulk sub-magnets 6a-6c all have an identical outer diameter and inner diameter. Further, in the example shown, the intermediate bodies 8a, 8b and the further intermediate body 8c have larger outer diameters and the same inner diameters as the bulk sub-magnets 6a-6c. It is also possible that the intermediate bodies 8a, 8b and the further intermediate body 8c have the same outer and inner diameters as the bulk sub-magnets 6a-6c (not shown).

A room temperature bore 7a of the cryostat 4 reaches into the superconductor bore 7. The electric charger magnet 3 or its charger bore 3a, the superconductor bulk magnet 5 or its superconductor bore 7, and the room temperature bore 7a are arranged coaxially. At a magnetic centre of the superconductor bore 7 and within the room temperature bore 7a, there is located a sample volume 10, at which a sample may be arranged which shall be exposed to the magnetic flux generated by the superconductor magnet system 2.

To measure and determine a magnetic field profile within the sample volume 10 of the room temperature bore 7a, a magnetic field sensor device 11 is used, here configured with one sensor 11a ("single sensor") attached to a movement stage 12 via a straight connector 12a. The sensor 11a is arranged on-axis with respect to the central axis A and can be moved vertically by the movement stage 12 within the sample volume 10. In this way on-axis gradients of the magnetic field profile and thereby on-axis inhomogeneities of the magnetic field profile can be measured in a relatively uncomplicated way.

The superconductor magnet system 2 further comprises a cryogenic cooling system 13 for cooling the superconductor bulk magnet 5. According to the invention, the temperature of each bulk sub-magnet 6a-6c may be individually adjusted by controlling a heating power and/or a cooling power at the respective bulk sub-magnet 6a-6c. For this purpose, here each bulk sub-magnet 6a-6c is connected to an electric heater element 15a, 15b, 15c and to a thermal switch 16a, 16b, 16c. Further, the electric heater elements 15a-15c and the thermal switches 16a-16c are connected to an adjustment unit 14 (connections shown with dotted lines), which here is integrated in an electronic control unit 18. Via the adjustment unit 14 it is possible to set variable heating powers at the heater elements 15a-15c and it is possible to open or to close the thermal switches 16a-16c and thus setting the cooling powers. The heating power of the electric heater elements 15a-15c may be variably adjusted by setting an electric current strength. The cooling power reaching the bulk sub-magnets 6a-6c via the thermal switches 16a-16c may be adjusted, i.e., switched off or on, by opening or closing the respective thermal switch 16a-16c each.

Each heater element 15a-15c is thermally coupled to one of the bulk sub-magnets 6a-6c. Each bulk sub-magnet 6a-6c is thermally coupled to the common cooling stage 9 via a thermal connection 17a, 17b, 17c here including the thermal switch 16a-16c. In the setting shown, the thermal switches 16a-16c are all opened so no cooling power is provided at the bulk sub-magnets 6a-6c. The common cooling stage 9 is, during the charging procedure and during normal operation, at a cryogenic temperature in general far below the critical temperature of the material of the bulk sub-magnets 6a-6c.

In order to cool the common cooling stage 9 during the normal operation, in the example shown, the cryostat 4 is permanently equipped with a first cryocooler 19, having its first cryocooler cold stage 19a inside the cryostat 4. The cryocooler cold stage 19a of the first cryocooler 19 is connected here via a thermal cryocooler impedance 20 to the common cooling stage 9.

During the charging procedure, operation of the first cryocooler 19 may be impaired by strong magnetic stray fields originating from the electric charger magnet 3, and possibly should not be used then. Therefore, in the example shown, the cryostat 4 further comprises a port 21 and supply lines 22 for leading an external cooling fluid from the port 21 to the common cooling stage 9 and back.

During the charging procedure, the port 21 is temporarily connected to an external, second cryocooler 23, whose second cryocooler cold stage 23a is arranged in a separate auxiliary cryostat 24. Inside this auxiliary cryostat 24, there run auxiliary supply lines 25 for transporting the cooling fluid from the cryocooler cold stage 23a of the second cryocooler 23 to the port 21 and back. Further it should be noted that during normal operation, it may be that less cooling power is needed as compared to the charging procedure, and so by using the second cryocooler 23 during the charging procedure, a smaller first cryocooler 19 for normal operation can be used.

When, at a specific bulk sub-magnet 6a-6c, the heating power of the heater element 15a-15c (if any), the cooling power of the common cooling stage 9 via the thermal switch 16a-16c (if any) and further heating power or cooling power via other heat conduction paths (such as black body radiation or remaining thermal conduction through the intermediate bodies 8a, 8b and the further intermediate body 8c) are in equilibrium, the bulk sub-magnet 6a-6c will maintain a stable temperature (equilibrium temperature). By altering the heating power of the heater elements 15a-15c and/or the cooling power via the thermal switches 16a-16c, different equilibrium states may be set, and thus different equilibrium temperatures may be obtained, even if their temperature values are not known. Note that the bulk sub-magnets 6a-6c are not equipped with thermal sensors for monitoring the temperature of the respective bulk sub-magnet 6a-6c.

The magnetic field sensor device 11, the heater elements 15a-15c and the thermal switches 16a-16c are connected to the electronic control unit 18. The magnetic field sensor device 11 measures the magnetic field profile, which helps to determine the inhomogeneities of the magnetic field profile and to monitor the progress of correction of the magnetic field profile. The electronic control unit 18 controls the heating powers of the heater elements 15a-15c and the thermal switches 16a-16c, and thereby the temperatures (and in particular the equilibrium temperatures) of the bulk sub-magnets 6a-6c during the charging of the superconductor bulk magnet 5 and during correction of the magnetic field profile of the superconductor bulk magnet 5, in particular in a posterior correction step.

In order to correct the magnetic field profile, individual bulk sub-magnets 6a-6c may be brought into a drifting state for some time. Whether a suitable drifting state of a particular bulk sub-magnet 6a-6c for improving field homogeneity is present can be observed best by monitoring the magnetic field profile as a function of time. Note that knowledge of the present temperature of a particular bulk sub-magnet 6a-6c is not required for this purpose.

Figure 2:
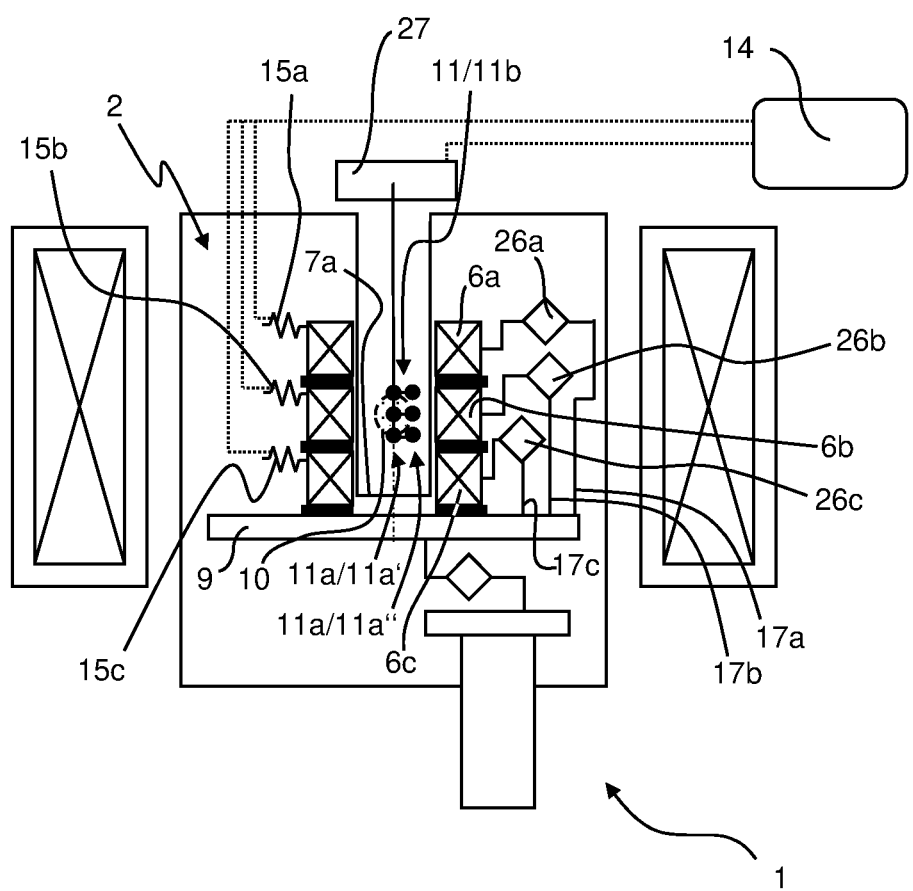
FIG. 2 shows a schematic view of a second embodiment of an inventive superconductor magnet system with a layout of magnetic field sensors, non-variable thermal impedances and heaters, for performing the method according to the invention.
Figure 3:
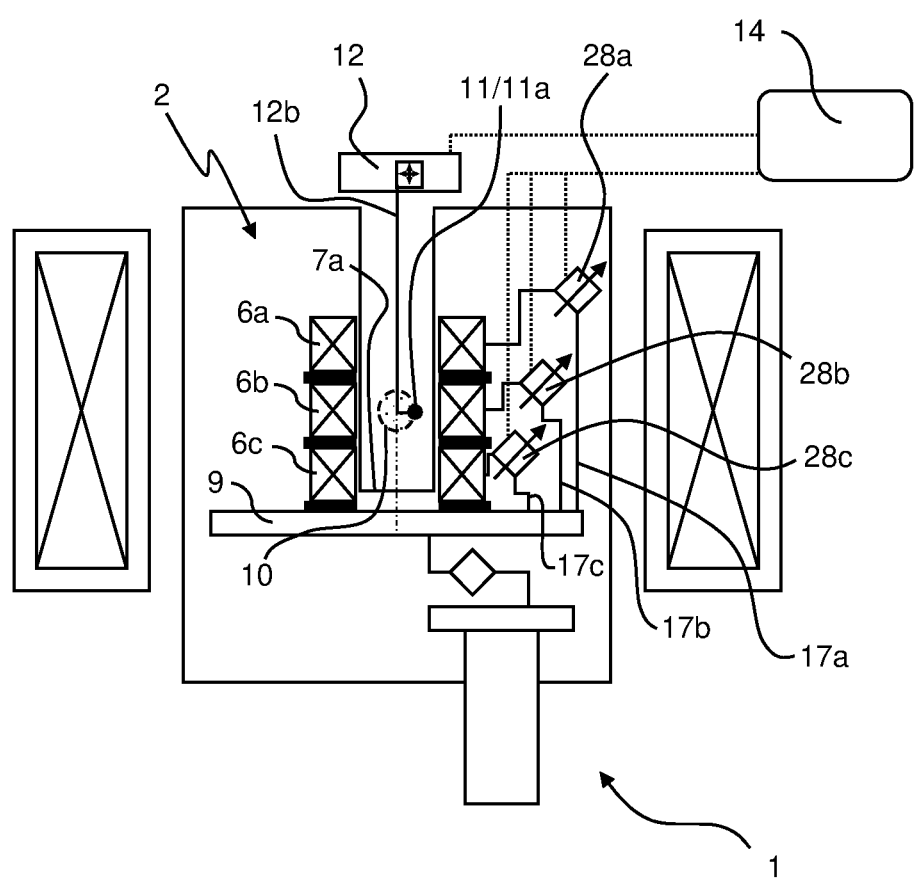
FIG. 3 shows a schematic view of a third embodiment of an inventive superconductor magnet system with a single off-axis magnetic field sensor and variable thermal impedances, for performing the method according to the invention.
Figure 4:
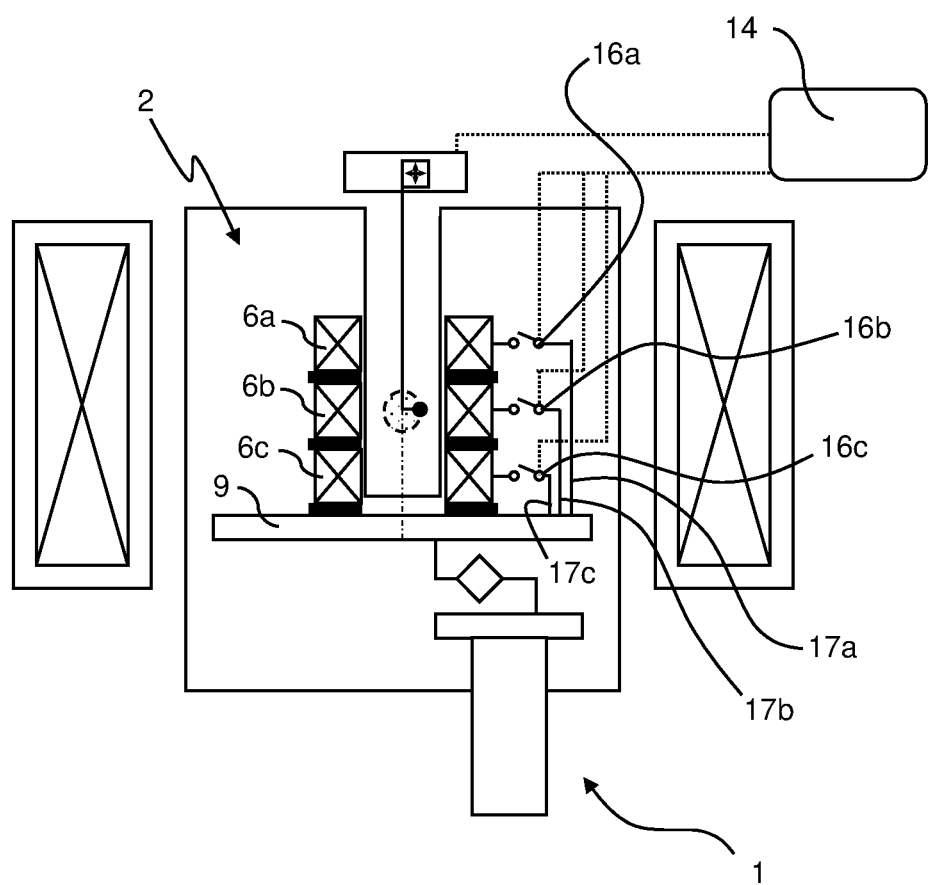
FIG. 4 shows a schematic view of a fourth embodiment of an inventive superconductor magnet system with a single off-axis magnetic field sensor and thermal switches, for performing the method according to the invention.

Note that the following FIG. 2-4 show the superconductor magnet system 2 of FIG. 1 with alterations. For this reason, only deviations of features with respect to the embodiment of FIG. 1 are described below. Note that in the embodiments shown in FIG. 2-4 the second cryocooler 23 is still a part of the superconductor magnet system 2 but is not shown for sake of simplicity. However it is also possible to use a superconductor magnet system 2 with only the first cryocooler 19 and without the second cryocooler 23; in this case the first cryocooler 19 may be shielded against the strong magnetic (stray) fields originating from the electric charger magnet 3, so the operation of the first cryocooler 19 is not impaired. Further all of the below shown superconductor magnet systems 2 have in common that no thermal sensors are used for measuring the temperatures of the bulk sub-magnets 6a-6c.

FIG. 2 shows in a schematic view a superconductor charging arrangement 1 by way of example, comprising a second embodiment of an inventive superconductor magnet system 2. Compared to FIG. 1 another type of magnetic field sensor device 11 is used and the thermal switches are replaced by non-variable ("fixed") thermal impedances 26a, 26b, 26c.

To measure and determine a magnetic field profile within the sample volume 10 of the room temperature bore 7a, the magnetic field sensor device 11 is used, here configured with a layout 11b of sensors 11a ("multiple sensors") attached to a static stage 27. The layout 11b of sensors 11a comprises here six sensors 11a. Three sensors 11a' are arranged on-axis with respect to the central axis A and three sensors 11a" are arranged off-axis with respect to the central axis A. In this way on-axis gradients and off-axis gradients of the magnetic field profile and thereby on-axis inhomogeneities and off-axis inhomogeneities of the magnetic field profile can be measured simultaneously and directly. The layout 11b of the sensors 11a is fixed here. In the layout 11b of sensors 11a, hall sensors may be used.

In the example shown, the respective electric heater elements 15a-15c are connected to the adjustment unit 14. The adjustment 14 unit can variably adjust only a heating power at each bulk sub-magnet 6a-6c. Each bulk sub-magnet 6a-6c is thermally coupled to the common cooling stage 9 via the thermal connection 17a-17c here including the non-variable thermal impedance 26a-26c. This constantly provides a cooling power to the bulk sub-magnets 6a-6c when the common cooling stage 9 is cold.

FIG. 3 shows in a schematic view a superconductor charging arrangement 1 by way of example, comprising a third embodiment of an inventive superconductor magnet system 2. Compared to FIG. 1 the magnetic field sensor device 11 is slightly modified, the thermal switches are replaced by variable thermal impedances 28a, 28b, 28c and the heater elements have been removed.

To measure and determine a magnetic field profile within the sample volume 10 of the room temperature bore 7a, the magnetic field sensor device 11 is used, here configured with the sensor 11a attached to the movement stage 12 via an angled connector 12b. The sensor 11a is arranged off-axis with respect to the central axis A and can be moved parallel to the central axis A by the movement stage 12 within and along the sample volume 10. Furthermore, the sensor 11a can be rotated around the central axis A. Typically, sensor 11a is a high fidelity sensor. Different positions within and along the sample volume 10 are scanned. Then by means of a spherical harmonics analysis the on-axis gradients and the off-axis gradients are computed. In this way the on-axis and off-axis magnetic field profile and thereby on-axis inhomogeneities and off-axis inhomogeneities of the magnetic field profile can be determined with only one sensor 11a.

In the example shown the respective variable thermal impedances 28a-28c are connected to the adjustment unit 14. The adjustment unit 14 can variably adjust only a cooling power at each bulk sub-magnet 6a-6c. Each bulk sub-magnet 6a-6c is thermally coupled to the common cooling stage 9 via the thermal connection 17a-17c here including the variable thermal impedance 28a-28c.

FIG. 4 shows in a schematic view a superconductor charging arrangement 1 by way of example, comprising a fourth embodiment of an inventive superconductor magnet system 2. Compared to FIG. 3 the variable thermal impedances are replaced by the thermal switches 16a-16c.

In the example shown the respective thermal switch 16a-16c is connected to the adjustment unit 14. The adjustment units 14 can adjust a cooling power only by switching between no cooling power or maximum cooling power coming from the common cooling stage 9 at each bulk sub-magnet 6a-6c. Each bulk sub-magnet 6a-6c is thermally coupled to the common cooling stage 9 via the thermal connection 17a-17c here including the thermal switch 16a-16c. In a typical operation method of this embodiment, in the beginning the thermal switches 16a-16c are closed and the bulk sub-magnets 6a-6c are cooled down with maximum cooling power, and the charger current is ramped down. The magnetic field profile is then measured and the overcharged bulk sub-magnets 6a-6c are identified. The respective thermal switches 16a-16c are opened. The temperature at the respective bulk sub-magnet 6a-6c will somewhat increase then as no (direct) cooling power is applied, and the respective bulk sub-magnets 6a-6c will drift. When the homogeneity of the magnetic field profile, or the contribution of the respective bulk sub-magnet to the magnetic field profile respectively, is as desired then the respective thermal switch 16a-16c is closed and maximum cooling power is applied to the respective bulk sub-magnet 6a-6c, stopping the drift there. Note that, in general, the thermal switches 16a-16c of the different bulk sub-magnets 6a-6c will have to be closed at different points of time. Alternatively, during a posterior correction step, cooling power may effectively be variably adjusted by quickly changing between open and closed state at a thermal switch 16a-16c of a respective bulk sub-magnet 6a-6c and adjusting the ratio of the duration of open and closed phases.

Homogenizing a Magnetic Field Profile

Figure 5:
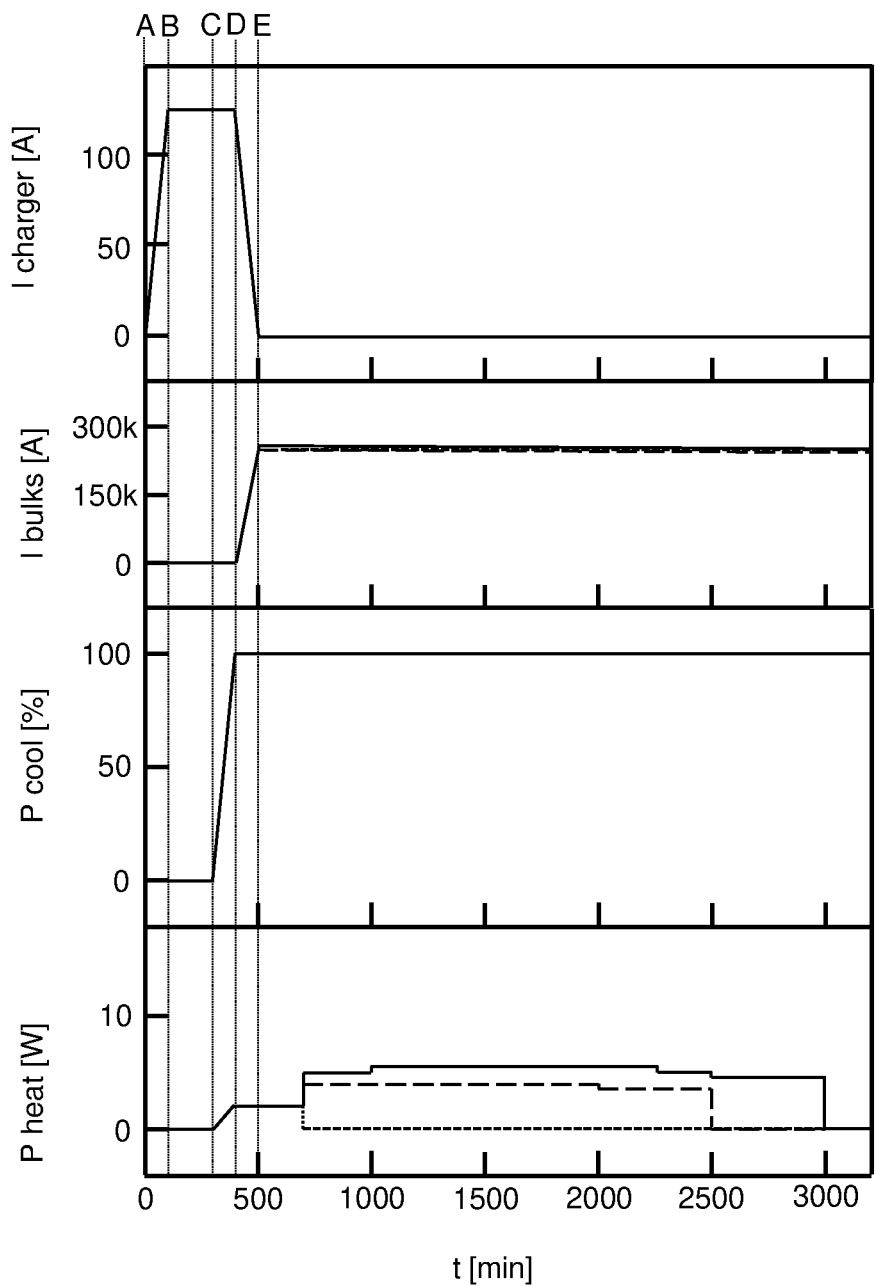
FIG. 5 shows a schematic schedule for the charger current, the currents of the bulk sub-magnets, the overall cooling power and the heating powers at the bulk sub-magnets for a variant of the inventive method.
Figure 6:
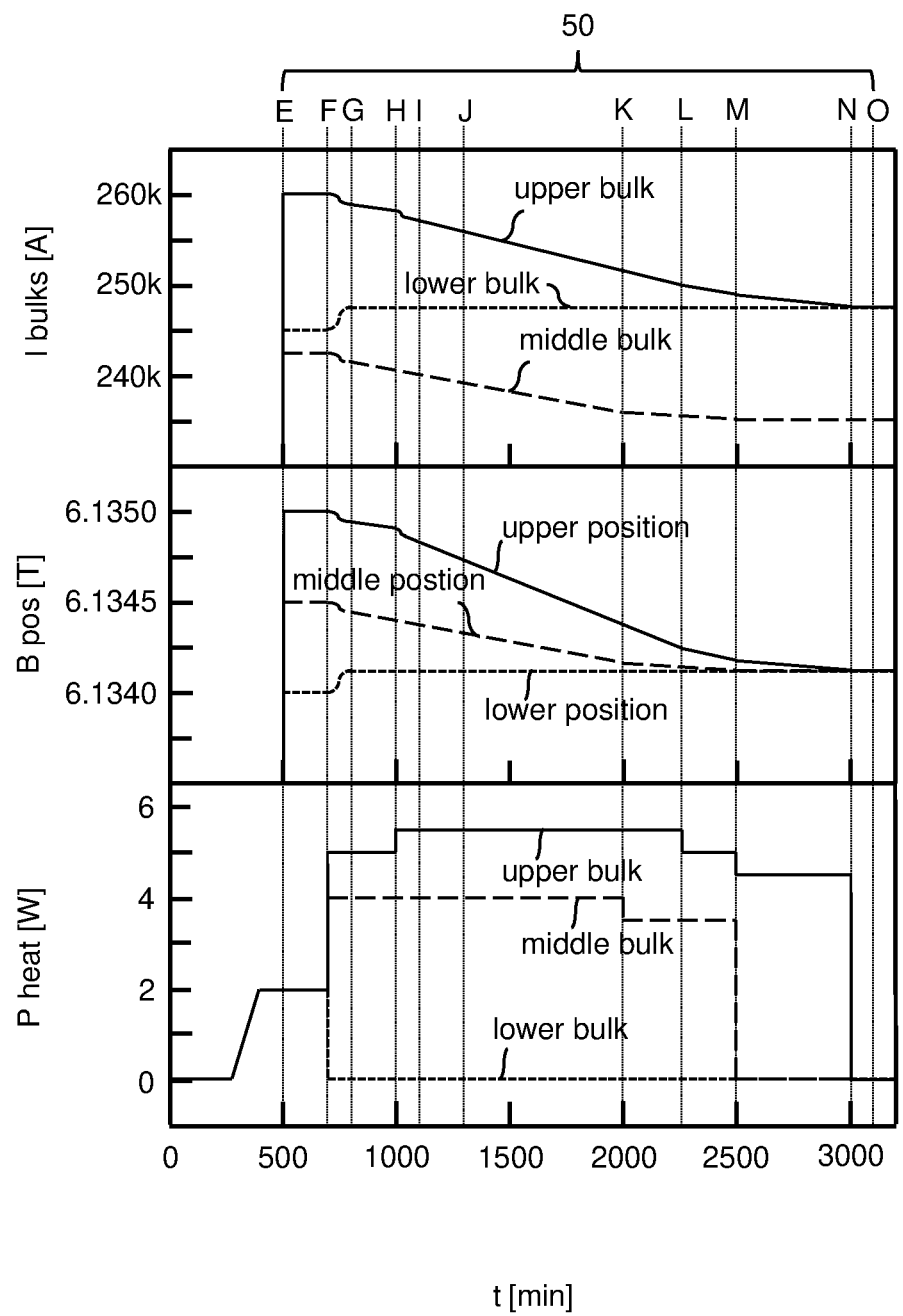
FIG. 6 shows a magnification of the currents of the bulk sub-magnets and the heating powers at the bulk sub-magnets of the schematic time schedule in FIG. 5 and additionally the local flux densities at three positions along the magnetic axis.

The present invention is used to homogenize the magnetic field profile of a superconductor magnet system after an initial field cooling step has been applied (for the initial field cooling step see European Patent Application EP 3910651 A1, the full content of which is herewith incorporated by reference). The use of the inventive method is illustrated in FIG. 5 and FIG. 6 by way of example for a superconductor magnet system as shown in FIG. 2 (i.e., a superconductor magnet system comprising three bulk sub-magnets, heaters, non-variable thermal impedances and a magnetic field sensor device). Note that the inventive method may be also used with other superconductor magnet systems. In general, in the course of the inventive method applying a posterior correction step, the current strengths of the individual bulk sub-magnets are only slightly altered, such that the final currents deviate typically by 10% or less from the initial currents each, and often by 5% or less.

FIG. 5 illustrates, as a function of time t plotted to the right, the charger current "I charger" (top diagram), an overview over the individual currents in the bulk sub-magnets ("I bulks", second to top diagram), the overall cooling power ("P cool", second to last diagram), and the heating powers applied to the individual bulk sub-magnets ("P heat", last diagram). The focus in FIG. 5 is primarily on the initial field cooling step, in other words the steps before the posterior correction step takes place.

In time interval A-B, the charger magnet is ramped up to a charger current I charger of about 125 A (Ampere), with the bulk sub-magnets being at a temperature that is above their critical temperature $T_{crit}$, so the bulk sub-magnets remain uncharged. After a waiting interval B-C, the cooling power P cool at the bulk sub-magnets is increased in interval C-D from 0% to 100% by bringing the common cooling stage down to its operation temperature (applying the second cryocooler). In the same interval C-D the heating power at all bulk sub-magnets is increased from 0 W (Watt) to 2 W. As a result, the temperature of the bulk sub-magnets decreases below $T_{crit}$.

In the initial field-cooling step in time interval D-E, the charger current I charger is lowered to zero, what induces initial currents in the bulk sub-magnets of about 240 to 260 kA according to an initial distribution scheme. The bulk sub-magnets are now in an initial state. The initial currents in the initial state generate a magnetic field profile in the sample volume of the superconductor magnet system. To increase the homogeneity of the magnetic field profile within the sample volume inside the room temperature bore, then the posterior correction step is executed. The posterior correction step adjusts the initial currents and thereby the magnetic field profile based on the initial currents.

FIG. 6 shows, as its focus, the posterior correction step 50. Illustrated as a function of time t plotted to the right are a magnification of the currents in the bulk sub-magnets of FIG. 5 ("I bulks", top diagram), a magnification of the magnetic flux density ($B_Z$) generated by the entirety of the bulk sub-magnets at three positions on the z-axis (axis A), namely at a middle position at the centre of the sample volume (indicative of a middle bulk sub-magnet contribution), at an upper position (indicative of an upper bulk sub-magnet contribution) and at a lower position (indicative of a lower bulk sub-magnet contribution) ("B pos", middle diagram; also compare FIG. 7), and a magnification of the heating powers applied to the bulk sub-magnets of FIG. 5 ("P heat", last diagram). The solid line refers to the upper bulk sub-magnet (compare bulk sub-magnet 6a in FIG. 2) or the upper position, the dashed line refers to the middle bulk sub-magnet (compare bulk sub-magnet 6b in FIG. 2) or the middle position and the small, dashed line refers to the lower bulk sub-magnet (compare bulk sub-magnet 6c in FIG. 2) or the lower position.

After switching off the charger magnet at time point E the current of the upper bulk sub-magnet is at about 260 kA, the current of the middle bulk sub-magnet is at about 242.5 kA and the current of the lower bulk sub-magnet is at about 245 kA. Also at time point E the magnetic field profile in the sample volume (and in vicinity to the sample volume) is measured. After waiting a relaxation time here in time interval E-F, the magnetic field profile is measured again to make sure that relaxation of the initial field cooling step is complete. The magnetic flux density at the upper position is at about 6.1350 T (Tesla) and the magnetic flux density at the middle position is at about 6.1345 T. The magnetic flux density at the lower position is at about 6.1340 T. Since the correction of the magnetic field profile by the posterior correction step will, above all, decrease the magnetic flux density contribution of individual bulk sub-magnets, the bulk sub-magnet or the respective location with the smallest magnetic flux density is chosen as a preliminary reference value. In this case the magnetic flux density at the lower position of about 6.1340 T is chosen as the preliminary reference value. Compared to this value the magnetic flux density at the upper position and at the middle position are too large. The upper and middle bulk sub-magnets are overcharged bulk sub-magnets and in order to increase the homogeneity of the magnetic field profile, their contribution to the magnetic field profile shall be reduced.

To correct the magnetic field profile based on the initial currents at time point F and to initiate the desired redistribution of currents in the bulk sub-magnets the heating powers of the respective bulk sub-magnets are set differently. The heating power of the lower bulk sub-magnet is decreased from 2 W to 0 W as the magnetic flux density at the lower position is already as desired (or at least should not be decreased). In this way the temperature of the lower bulk sub-magnet is further decreased, and the lower bulk sub-magnet is safely brought significantly away from magnetic saturation. This prevents a gradual loss of its current (drift) and conserves its magnetic field profile contribution. The lower bulk sub-magnet is assigned to a second part of the bulk sub-magnets that is significantly away from magnetic saturation. In contrast, the middle bulk sub-magnet and the upper bulk sub-magnet should lose some current to reduce their contribution to the magnetic field profile. For this purpose, they should be brought at least almost to magnetic saturation for some time, and they are chosen for a first part of the bulk sub-magnets that is at least almost magnetically saturated. The heating power of the overcharged middle bulk sub-magnet is increased from 2 W to 4 W as the magnetic flux density at the middle position is larger than desired. The heating power of the overcharged upper bulk sub-magnet is increased from 2 W to 5 W as the magnetic flux density at the upper position is even larger as the magnetic flux density at the middle position.

When the heating power at the upper bulk sub-magnet and the middle bulk sub-magnet is increased, the temperature at both bulk sub-magnets rises and reaches a certain value (or new equilibrium temperature). The temperature increase reduces their superconducting current carrying capacity, and therefore brings them closer to or even to magnetic saturation, as is the case here. After time point F, the current of the upper bulk sub-magnet has dropped here from about 260 kA to 258.5 kA when reaching time point G and the current of the middle bulk sub-magnet has dropped from about 242.5 kA to 241.5 kA when reaching time point G. In turn the lower bulk sub-magnet takes over some of the magnetic flux and corresponding electric current, and its current increases from about 245 kA to 247.5 kA, and the magnetic flux density at the lower position increases to about 6.1342 T (representing a new reference value of magnetic flux density). It may be noted here that the redistribution of the currents due to the temperature changes in time interval F-G is in practice not instantaneous, such that said redistribution somewhat reaches beyond time point F, what can be considered a relaxation effect.

After the first change in heating power (at time point F) a first time period between time points F and G is waited such that the relaxation can be completed. Beginning at time point G, a first measurement of the intermediate magnetic field profile is performed. Then a second time period between time points G and H is waited and after that at time point H a second measurement of the intermediate magnetic field profile is performed. From these measurements a current drift characteristic can be determined for the bulk sub-magnets. Note that the first time period (waiting time) ensures that over the second time period, a then quasi linear drift can be directly observed at the bulk sub-magnets.

Here the middle bulk sub-magnet shows a relatively high drift since it is at or very close to its magnetic saturation (above 99% of magnetic saturation). The heating power is kept as the current drift characteristic in this case is as desired.

Over the further course of the drift of the middle bulk sub-magnet, the magnetic field profile is repeatedly measured (here between time points H to N). At time point K the current of the middle bulk sub-magnet is about 236 kA and the magnetic flux density at the middle position approaches the desired magnetic flux density. The heating power is reduced from 4 W to 3.5 W (at time point K) to slow down the drift and to enable a precise adjustment of the contribution of the middle bulk sub-magnet to the magnetic field profile during the homogenization process. As can be seen in FIG. 6, the drift is less steep from point of time K on, as compared to before point of time K. Again, the current drift characteristic may be determined as described above (not described in detail); the heating power is kept then as the current drift characteristic (between K and M) in this case is as desired.

The contribution of the middle bulk sub-magnet to the magnetic field profile is further, but more slowly reduced in a final phase (here in time interval K-M). At time point M, the magnetic flux density at the middle position has reached the desired magnetic flux density (i.e., the reference value). The current of the middle bulk sub-magnet is about 235 kA now. The heating power is reduced from 3.5 W to 0 W. The temperature at the middle bulk sub-magnet decreases such that the middle bulk sub-magnet is so far away from magnetic saturation that drift becomes negligible. The middle bulk sub-magnet from time point M on belongs to the second part of the bulk sub-magnets as it is significantly away from magnetic saturation then.

From the measurements of the intermediate magnetic field profiles at time point G and H, the current drift characteristic related to the upper bulk sub-magnet can be determined. Here the magnetic flux density at the upper position, and thus the upper bulk sub-magnet shows a mediocre drift in time interval G-H. Keeping this drift would lead to an overall processing time of about 5000 minutes and not (as intended) about 3000 minutes. Therefore, the heating power at the upper bulk sub-magnet is increased from 5 W to 5.5 W at time point H as the current drift characteristic in this case is not as required, in order to accelerate the drift. Note that the current of the upper bulk sub-magnet shows a very small drop from about 258.2 kA to 258.0 kA between time points H and I. This drop in current is so small that it in this case it is not noticeably affecting the current of the middle bulk sub-magnet and the lower bulk sub-magnet.

After the second change in heating power (time point H) a further first time period between time points H and I is waited such that the relaxation can be completed. At time point I, a further first measurement of the intermediate magnetic field profile is performed. Then a further second time period between time points I and J is waited and after that a further second measurement of the intermediate magnetic field profile at time point J is performed. From these measurements the current drift characteristic is determined again. Here the magnetic flux density at the upper position, and thus the upper bulk sub-magnet shows a relatively high drift since it is at or very close to its magnetic saturation (e.g., above 99% of magnetic saturation). The heating power is kept as the current drift characteristic in this case is now as desired.

Over the course of the drift, the magnetic field profile is repeatedly measured (here between time points J to N). At time point L the current of the upper bulk sub-magnet is about 250 kA and the magnetic flux density at the position approaches the desired magnetic flux density. The heating power is reduced from 5.5 W back to 5 W at the upper bulk sub-magnet (at time point L) to slow down the drift and to enable a precise adjustment of the contribution of the upper bulk sub-magnet to the magnetic field profile during the homogenization process. Again, the current drift characteristic may be determined as described above (not described in detail). Then the heating power is further reduced from 5 W to 4.5 W for the upper bulk sub-magnet (at time point M) to further slow down the drift.

The contribution of the upper bulk sub-magnet to the magnetic field profile is further, but more slowly reduced in a final phase (here in time interval M to N). At time point N the magnetic flux density at the upper position has reached the desired magnetic flux density (i.e., the reference value) and the current of the upper bulk sub-magnet is about 247.5 kA. The heating power is reduced from 4.5 W to 0 W. The temperature at the upper bulk sub-magnet decreases such that the upper bulk sub-magnet is so far away from magnetic saturation that drift becomes negligible.

The time interval E-O, during which the currents I bulks in the bulk sub-magnets are changed and in particular fine-tuned by drift, is called the posterior correction step 50. During this posterior correction step 50, currents I bulks in the bulk sub-magnets of an initial state ("initial currents" at time point E), coming along with a low magnetic field homogeneity, are changed into currents I bulks in the bulk sub-magnets of a final state ("final currents" at time point N), coming along with a high magnetic field homogeneity. Typically, the homogeneity in the sample volume during the posterior correction step can be increased by a factor of 3 or more, often 5 or more, preferably by a factor of 10 or more, and most preferably by a factor of 20 or more. At time point O a last measurement of the magnetic field profile is executed to check whether the posterior correction step 50 has been successful.

Figure 7:
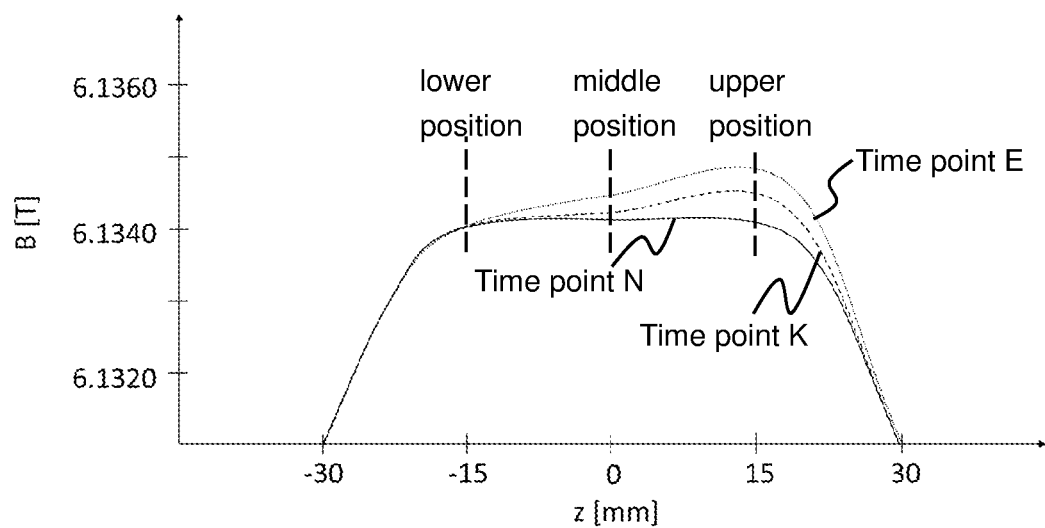
FIG. 7 shows a schematic diagram of magnetic field profiles obtained in the course of the variant of the inventive method shown in FIG. 5 and FIG. 6 at three time points.

FIG. 7 shows the time development of the magnetic field profile in the vicinity of the magnetic centre at z=0. The magnetic flux density B is plotted to the top, and the position on the z axis is plotted to the right. As points in time, E (dotted line), K (dashed line) and N (solid line) from FIG. 6 are illustrated. Also, the upper, middle and lower positions where the magnetic flux density has been measured for FIG. 5 are illustrated.

At time point E, the magnetic field profile shows a significant inhomogeneity between −15 mm and +15 mm (which here represents the sample volume extension), with B varying between about 6.1340 Tesla and 6.1350 Tesla, corresponding to about 163 ppm. The magnetic field profile exhibits a pronounced maximum at +15 mm, at about the upper position, and still a significantly higher B at the middle positions as compared to the lower position, indicating that the magnetic field contribution of the upper bulk sub-magnet is much too large and that of the middle bulk sub-magnet is somewhat too large.

Over the course of the drift between time points E and N the homogeneity gradually increases, since the relative contributions of the upper bulk sub-magnet and the middle bulk sub-magnet decrease. The final state magnetic field distribution at time point N between −15 mm and +15 mm has an inhomogeneity of less than 25 ppm here.

Figure 8:
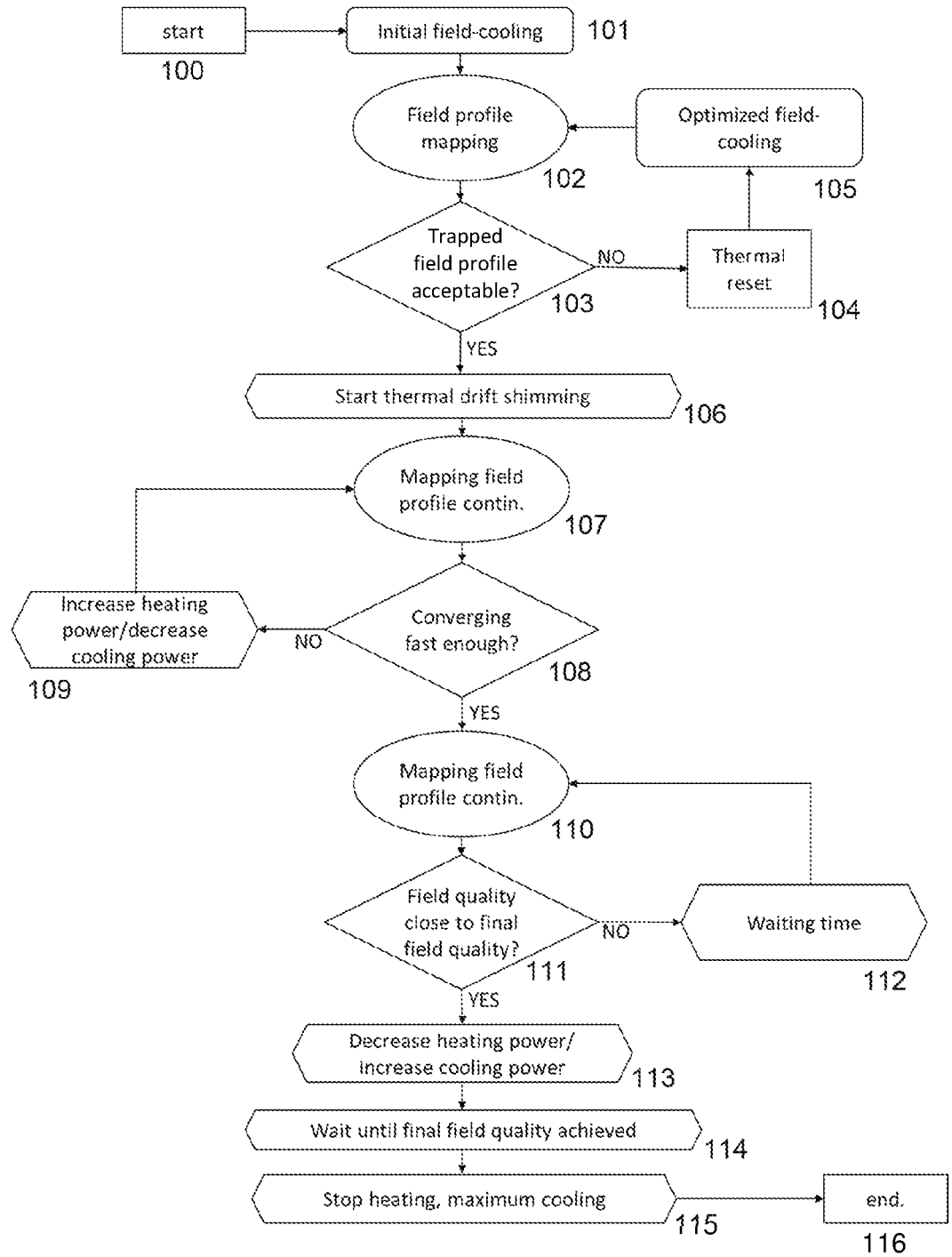
FIG. 8 shows a schematic diagram for an overall charging procedure in accordance with the inventive method, in an exemplary variant.

FIG. 8 shows a schematic flow diagram of a charging procedure for a superconductor magnet system, in particular an inventive superconductor magnet system (as shown, e.g., in FIG. 1), including a method of homogenization of the magnetic field profile in an exemplary variant of the invention.

Since steps 100-105 of the charging procedure have been described in detail in European Patent application EP 3910651 A1, this first part of the schematic flow diagram is only described in short here. The contents of European patent application EP 3910651 A1 are incorporated by reference accordingly. The procedure, after the start 100, includes first an initial field cooling step 101. In the course of it, the charger current of a charger magnet is ramped up with the bulk magnet above $T_{crit}$, and then the bulk magnet is cooled below $T_{crit}$ and the charger current is ramped down. Main currents according to a basic distribution scheme are induced in the bulk sub-magnets of the bulk magnet, according to the intrinsic characteristics of the charger magnet and the superconductor magnet system. The resulting magnetic field profile is then mapped 102 and evaluated in a step 103.

If the magnetic field profile is not acceptable with respect to its homogeneity in the sample volume a thermal reset 104 is done, i.e., the superconductor bulk magnet is discharged and warmed above its critical temperature again. Then, with the knowledge of the inhomogeneity obtained in the charging step (here step 101) before, an optimized field cooling 105 is done including a preparatory charging step. After that, the magnetic field profile is mapped again 102, and evaluated 103. In case the trapped field profile is still not acceptable, another thermal reset 104 and another optimized field cooling step 105 may be included.

If the magnetic field profile is acceptable, a thermal drift shimming 106 is begun, i.e., a homogenization using a posterior correction step is started according to the inventive method. For this purpose, the part of the bulk sub-magnets to have their contribution to the magnetic field profile reduced for improving field homogeneity are determined. Then the respective bulk sub-magnets shall be brought at least close to magnetic saturation, and therefore the heating power is increased and/or the cooling power is decreased and thus the temperature is increased at respective bulk sub-magnets. In this way the respective drift may be initiated in the respective bulk sub-magnets, thus decreasing the contribution of the respective bulk sub-magnets to the magnetic field profile. The magnetic field profile is repeatedly mapped 107 and evaluated with respect to convergence 108 (i.e., is the drift characteristic such that the inventive method will lead to a desired homogeneous field profile and can be executed in a reasonable time frame, e.g., in a time frame of 3000 minutes).

If the magnetic field profile does not converge fast enough towards the desired magnetic field profile (in particular taking into account a desired homogeneity), the heating power is slightly increased and/or the cooling power is slightly decreased at one or a plurality of bulk sub-magnets 109, in particular to increase drift in these bulk sub-magnets. If need may be, an initially too fast drift may also be reduced in individual bulk sub-magnets by reducing the heating power or increasing the cooling power in step 109. The mapping of the magnetic field profile is continued 107 and the evaluation of convergence 108 repeated, and if necessary, further alteration steps 109 changing the temperature distribution within the bulk sub-magnets may be included.

Note that in all of these steps measurements of the temperatures at the bulk sub-magnets are not necessary as the knowledge about the temperatures at the bulk sub-magnets is not needed for magnetic field profile adjustment. It is enough to regularly measure the magnetic field profile and observe the changes of the magnetic field profile, and in particular, to determine the drift characteristic of the bulk sub-magnets.

If the magnetic field profile converges fast enough the level of the heating power and/or the cooling power at the respective bulk sub-magnets is kept. The magnetic field profile is repeatedly mapped again 110. It then is evaluated if the field quality of the magnetic field profile is close to a final field quality (desired field quality) 111. A typical criterion for identifying the magnetic field profile to be close to the final field quality ("close status") can be a remaining deviation (RD) of the magnetic flux density (at a particular position) from the final magnetic flux density (at that position) that is at or less than a limit value, preferably as compared to an original deviation (OD) of the magnetic flux density (at that position) from the final magnetic flux density (at that position) at the beginning of the posterior correction step. Typically, the limit value is chosen as a relative limit value RLM for the ratio of RD/OD, preferably with RLM being chosen with RLM ≤25%, more preferably with 5%≤RLM≤20%. Note that the final magnetic flux density at the position in general corresponds to the reference value, which is the smallest magnetic field density in the magnetic field profile (of all positions in the sample volume) after the last increase of heating power or decrease of cooling power.

If the magnetic field profile is not close to the final field quality the present drift is allowed to continue during some waiting time 112. The mapping of the magnetic field profile is continued 110 and the evaluation if the magnetic field profile is close to the final field quality is repeated 111. If necessary, the mapping of the field profile is carried on 112.

If the magnetic field profile is close to the final field quality the heating power is decreased and/or the cooling power is increased 113 to slow down the drift of the magnetic field profile; note that this may be done individually for different bulk sub-magnets. In this step 113 it may be checked whether the new drift characteristic is as desired and, if not, the heating power is decreased and/or the cooling power is increased further. The mapping of the field profile is continued, and it is waited until the desired magnetic field profile is reached 114. When the desired field quality is reached the heating is stopped and/or the cooling power is increased to maximum 115 such that no significant drift occurs anymore, and the procedure finally ends 116. The whole method took place without measuring the exact temperatures at the bulk sub-magnets.

The invention claimed is:
1. A method for homogenizing a magnetic field profile of a superconductor magnet system having a cryostat with a room temperature bore, a superconductor bulk magnet contained in the cryostat and arranged coaxially with the room temperature bore, and a cryogenic cooling system adapted for cooling the superconductor bulk magnet, wherein the superconductor bulk magnet comprises at least three axially stacked bulk sub-magnets that, in an initial state, carry respective initial currents with relative proportions according to an initial distribution scheme, and that provide an initial magnetic field profile, the method comprising:
    independently controlling a temperature of each bulk sub-magnet with the cryogenic cooling system to provide different respective temperatures to the sub-magnets and thereby provide the sub-magnets with different relative currents such that a first subset of the bulk sub-magnets has at least 99% relative magnetic saturation, and a second subset of the bulk sub-magnets has at most 95% relative magnetic saturation;

mapping an initial magnetic field profile of the superconductor bulk magnet to determine a homogeneity thereof; and controlling a relative heating power and/or a cooling power provided to the first and second subsets of the bulk sub-magnets by the cryogenic cooling system without measuring the temperatures of the bulk sub-magnets so as to change the respective currents of the bulk sub-magnets to increase a homogeneity of said field profile.

2. The method according to claim 1, wherein the superconductor magnet system comprises no thermal sensors.

3. The method according to claim 1 wherein, in the first part, the heating powers at the bulk sub-magnets are chosen at least temporarily higher as compared to the second part, and/or in the first part, the cooling powers at the bulk sub-magnets are chosen at least temporarily lower as compared to the second part.

4. The method according to claim 1 wherein, during the posterior correction step, an intermediate magnetic field profile of the superconductor magnet system is repeatedly measured until a desired magnetic field profile based on the final currents is obtained, wherein between measurements, the heating power and/or cooling power at at least some of the bulk sub-magnets are changed and/or some time is waited.

5. The method according to claim 4 further comprising identifying, with the intermediate magnetic field profile, one or more of the bulk sub-magnets that are overcharged relative to the other bulk sub-magnets, and reducing the cooling power and/or increasing the heating power to the overcharged bulk sub-magnets.

6. The method according to claim 5 wherein, for at least a portion of the overcharged bulk sub-magnets, an amount by which the cooling power is decreased and/or the heating power is increased, is decreased with time in a final phase of reducing a contribution of the respective bulk sub-magnet to the magnetic field profile.

7. The method according to claim 4 wherein, after having changed the heating power and/or the cooling power at at least some of the bulk sub-magnets, a first time period is waited, a first measurement of an intermediate magnetic field profile is done, a second time period is waited, and a second measurement of an intermediate magnetic field profile is done, and wherein from at least the first and second measurement, a current drift characteristic of the intermediate magnetic field profile is determined and, based on the determined current drift characteristic, changes are made in the heating power and/or cooling power at at least some of the bulk sub-magnets and/or in a subsequent time to be waited.

8. A superconductor magnet system, comprising:
a cryostat having a room temperature bore,
a superconductor bulk magnet, contained in the cryostat and arranged coaxially with the room temperature bore, the superconductor bulk magnet having at least three axially stacked, substantially ring-shaped bulk sub-magnets separated by and supported on ring-shaped intermediate bodies made from a non-metallic thermal insulator material and having a specific thermal conductivity lower than a specific thermal conductivity of the material of the bulk sub-magnets, the sub-magnets and intermediate bodies being arranged coaxially with the room temperature bore, a cryogenic cooling system for cooling the superconductor bulk magnet that is adapted for independently controlling the temperature of each bulk sub-magnet, and an adjustment unit for each bulk sub-magnet that adjusts a heating power and/or a cooling power at the respective bulk sub-magnet, wherein the superconductor magnet system has no thermal sensors and does not measure the temperatures of the bulk sub-magnets.

9. The superconductor magnet system according to claim 8 wherein each bulk sub-magnet has a heater element thermally connected thereto.

10. The superconductor magnet system according to claim 8, wherein the cryogenic cooling system comprises a common cooling stage for all bulk sub-magnets, and each bulk sub-magnet has a thermal connection from the common cooling stage.

11. The superconductor magnet system according to claim 10, wherein each thermal connection includes a variable thermal impedance controlled by the adjustment unit for the bulk sub-magnet associated with that thermal connection, with the adjustment unit being configured to set a variable cooling power at the respective bulk sub-magnet.

12. The superconductor magnet system according to claim 8, further comprising a magnetic field sensor device for measuring a magnetic field profile within a sample volume of the room temperature bore.

13. The superconductor magnet system according to claim 12, wherein the magnetic field sensor device comprises at least one sensor arranged on a movement stage by means of which the at least one sensor may be moved within the sample volume for determining the magnetic field profile in the sample volume by repeated readout of the at least one sensor at different positions within the sample volume.

14. The superconductor magnet system according to claim 12, wherein the magnetic field sensor device comprises a layout of sensors distributed within the sample volume for determining the magnetic field profile in the sample volume by parallel readout of the sensors of the layout fixed in place.

15. The superconductor magnet system according to claim 12, further comprising an electronic control unit for automatically homogenizing a magnetic field profile in the room temperature bore, the electronic control unit repeatedly receiving measured intermediate magnetic field profiles measured with the magnetic field sensor device and, based on the intermediate measurements and without receiving or evaluating temperature data of the bulk sub-magnets, automatically controlling the heating power and/or cooling power at the bulk sub-magnets.

* * * * *